US011929283B2

(12) United States Patent
Huang et al.

(10) Patent No.: US 11,929,283 B2
(45) Date of Patent: Mar. 12, 2024

(54) BARRIER STRUCTURE FOR SEMICONDUCTOR DEVICE

(71) Applicant: TAIWAN SEMICONDUCTOR MANUFACTURING COMPANY LTD., Hsinchu (TW)

(72) Inventors: Pin Chi Huang, Hsinchu (TW); Chien-Chang Fang, Fongshan (TW); Rung Hung Hsueh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 244 days.

(21) Appl. No.: 16/554,572

(22) Filed: Aug. 28, 2019

(65) Prior Publication Data

US 2020/0075404 A1    Mar. 5, 2020

Related U.S. Application Data

(60) Provisional application No. 62/726,165, filed on Aug. 31, 2018.

(51) Int. Cl.
*H01L 21/768* (2006.01)
*H01L 21/02* (2006.01)
(Continued)

(52) U.S. Cl.
CPC .... *H01L 21/76865* (2013.01); *H01L 21/0217* (2013.01); *H01L 21/0245* (2013.01);
(Continued)

(58) Field of Classification Search
CPC ......... H01L 21/76804; H01L 21/76865; H01L 29/66795; H01L 29/785; H01L 21/76832;
(Continued)

(56) References Cited

U.S. PATENT DOCUMENTS

| 6,541,864 B1 * | 4/2003 | Fukuzumi ......... H01L 21/76807 257/E21.507 |
| 7,906,418 B2 * | 3/2011 | Yu ........................ H01L 27/115 438/585 |

(Continued)

FOREIGN PATENT DOCUMENTS

| CN | 1873946 | 12/2006 |
| CN | 101068018 | 11/2007 |

(Continued)

OTHER PUBLICATIONS

Catalan, Development of Silicon Nitride Etch Process, 2002, Annual Microelectronic Conference (Year: 2002).*

(Continued)

*Primary Examiner* — Mohammad A Rahman
(74) *Attorney, Agent, or Firm* — Hauptman Ham, LLP

(57) ABSTRACT

A semiconductor device includes a gate structure on a substrate and a dielectric film stack over the gate structure and the substrate, where the dielectric film stack includes a first inter layer dielectric (ILD) over the substrate and the gate structure, a barrier layer over the first ILD, a second ILD over the barrier layer, and a contact extending through the dielectric film stack. An upper portion of a contact sidewall has a first slope, a lower portion of the contact sidewall has a second slope different from the first slope, and a transition from the first slope to the second slope occurs at a portion of the contact extending through the barrier layer.

20 Claims, 6 Drawing Sheets

(51) Int. Cl.
*H01L 29/66* (2006.01)
*H01L 29/78* (2006.01)

(52) U.S. Cl.
CPC .. *H01L 21/02458* (2013.01); *H01L 21/76832* (2013.01); *H01L 29/66795* (2013.01); *H01L 29/785* (2013.01)

(58) Field of Classification Search
CPC ........... H01L 21/02458; H01L 21/0217; H01L 21/0245; H01L 23/485; H01L 21/76829; H01L 27/11521; H01L 21/76897; H01L 23/5386; H01L 21/76802–76813; H01L 21/76816; H01L 23/535; H01L 27/14636; H01L 21/823475
See application file for complete search history.

(56) References Cited

U.S. PATENT DOCUMENTS

| | | | |
|---|---|---|---|
| 10,177,215 B1* | 1/2019 | Srinivasan | H01L 29/66181 |
| 2004/0234894 A1 | 11/2004 | Kirmse | |
| 2007/0287286 A1 | 12/2007 | Nam et al. | |
| 2009/0065941 A1 | 3/2009 | La Tulipe, Jr. et al. | |
| 2011/0147939 A1* | 6/2011 | La Tulipe, Jr | H01L 21/76804 |
| | | | 257/758 |
| 2012/0161327 A1* | 6/2012 | Chumakov | H01L 21/76897 |
| | | | 257/773 |
| 2014/0264630 A1* | 9/2014 | Huang | H01L 21/76898 |
| | | | 257/401 |
| 2015/0171206 A1 | 6/2015 | van Dal | |
| 2017/0092693 A1 | 3/2017 | Tan et al. | |
| 2018/0033955 A1 | 2/2018 | Wong et al. | |
| 2019/0148374 A1* | 5/2019 | Bae | H01L 27/0207 |
| | | | 257/401 |

FOREIGN PATENT DOCUMENTS

| | | |
|---|---|---|
| CN | 101872742 | 10/2010 |
| CN | 106409756 | 2/2017 |
| CN | 107275281 | 10/2017 |
| CN | 107507807 | 12/2017 |
| CN | 107591418 | 1/2018 |
| TW | 200540969 | 12/2005 |
| TW | 201822280 | 6/2018 |

OTHER PUBLICATIONS

Office Action dated Dec. 22, 2020 for corresponding case No. CN 2019108169186. (pp. 1-8).
Office Action dated Jan. 17, 2022 for corresponding case No. CN 201910816918.6 (pp. 1-8).

* cited by examiner

BARRIER STRUCTURE FOR SEMICONDUCTOR DEVICE

BACKGROUND

Semiconductor devices are sometimes subject to short circuits, or shorts, where conductive materials are electrically connected either directly or across a thin insulating material in a semiconductor device. Shorts are prone to occur when electrical potential between the conductive materials is greater than a designed voltage for the semiconductor device, causing insulating material between conductive materials to break down. Electrical shorts lead to device failure when testing devices after a manufacturing process, and after periods of use by an end user.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
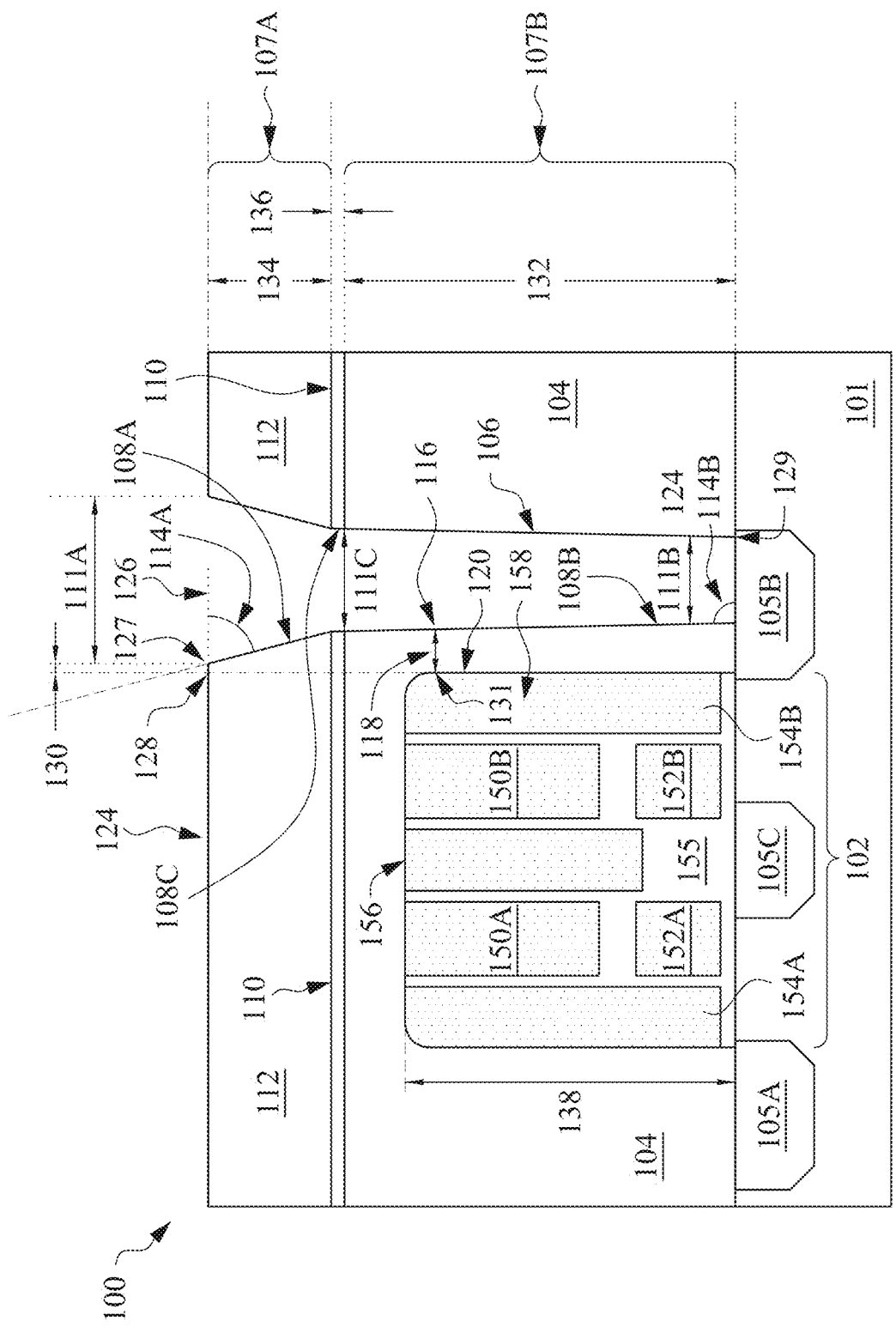
FIG. 1 is a schematic diagram of a semiconductor device with a gate structure and an adjoining contact structure, according to some embodiments.

The following disclosure provides different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Semiconductor devices are at risk for electrical shorts, where current discharges through insulating materials between conductive elements in an integrated circuit. When a contact is formed near gate structures, such as when making an electrical contact to source or drain regions associated with the gate structures, the sides of the contact approach the sides of the gate structures. While gate structures tend to have vertical sides, contacts tend to have sloped side. As a result, a distance between the top of the gate structure and a sidewall of the contact is less than a distance between the bottom of the gate structure and the contact sidewall. At points where the distance between contact sidewall and gate structure is smaller, electrical shorts are more likely to occur, such as when transient high voltages cause insulating materials between the contact and gate structure to break down and permit an electrical current to pass between the gate structure and the contact.

When an electrical short occurs, the supply current ($I_{dd}$) of the shorted gate structure, and the integrated circuit as a whole, increases. Supply current of a gate structure, and an integrated circuit, in a quiescent state (IDDQ, or $I_{dd,q}$) as close to zero current as possible helps to reduce parasitic power consumption of the semiconductor device. Thus, regulating the profile of the contact structure that makes an electrical connection to a source or drain, associated with a gate structure, helps to reduce the likelihood for electrical shorts to occur between gate structures and contact structures.

Further, regulating the profile of the contact is beneficial to the semiconductor device by helping to fully fill a contact opening, which reduces the resistance associated with the contact. In some instances, contacts are filled with conductive materials that include polysilicon, pure metals, or metal alloys. Some conductive material deposition processes are prone to formation of voids within the contact during deposition. Voids in contact structures are associated with increased contact resistance and, in some embodiments, reductions in the switching speed, or frequency, at which a semiconductor device operates, as compared to a design specification for the semiconductor device without the voids.

Making an integrated circuit or semiconductor device with two-slope contacts, as described below, enables a semiconductor device to conform to a device design or specification with a separation distance between contacts and adjacent gate electrode structures, while reducing the total area used by a transistor structure, including the source/drain, channel, gate electrode, and contacts that connect to the transistor. In some embodiments, a two-slope contact has a lower sidewall with a slope that ranges from about 85° to about 89.5° (e.g., within 5° of a "vertical" line extending perpendicularly upward from a top surface of the substrate having the source/drain structure therein), and an upper sidewall with a slope that ranges from about 45° to about 85° with respect to a vertical line extending upward from the substrate. In some instances, the upper sidewall and the lower sidewall have a juncture at a barrier layer between an upper inter-layer dielectric (ILD) and a lower ILD, where the barrier layer acts as a mask layer during an etch process that removes exposed lower ILD material through an opening in the barrier layer. The barrier layer has a thickness that is not more than about 10% of the total height of the contact opening/contact. The barrier layer between the upper ILD and the lower ILD enables the substantial "decoupling" of separation distance of the contact/contact sidewall from a gate structure covered by the ILD materials, and a size of the contact top area/contact opening. In some embodiments, the term "decoupling" refers to the linear relationship between the slope of the contact sidewall and the width of the contact top opening (or, contact top width, once the contact has been filled with conductive material). By positioning the barrier layer at a distance over the substrate that is greater than the first ILD thickness, the separation distance between the contact sidewall and the gate structure is determined separately from the width of the contact top opening or the contact top width.

FIG. 1 is a cross-sectional diagram of a semiconductor device 100 comprising a gate structure 102 on a substrate 101, the gate structure 102 being covered by a first interlayer dielectric (ILD) 104 and being adjacent to a contact 106. For the sake of clarity, the contact 106 is shown as a contact opening in FIG. 1. Gate structure 102 is a split gate flash memory cell having a pair of control gates 150A-150B, a pair of floating gates 152A-152B, and a pair of selecting gates 154A-154B. Gate element 156 is a common erase gate for each of the control gates 150A-150B and floating gates 152A-152B. Dielectric 155 is located between the gate elements of gate structure 102 and the substrate 101. Source/drain elements 105A, 105B, and 105C are located in substrate 101 and are electrically isolated from gate structure 102 by dielectric 155 and first ILD 104. A first contact (not shown, but see contact 382 in FIG. 3D) makes an electrical connection to source/drain element 105A, and a second contact (not shown, but see contact 382, FIG. 3D) makes an electrical connection to source/drain element 105A. Although gate structure 102 is a split gate flash memory cell, the present disclosure is not limited to split gate flash memory cells, and other types of gate structures are also included within the scope of the present disclosure. A contact etch stop layer (CESL) 110, or a barrier layer, is over first ILD 104. In some embodiments, CESL 110 is directly against a top surface of first ILD 104. In some embodiments, the first ILD is a single dielectric material. In some embodiments, the barrier layer is silicon nitride, silicon-oxy-nitride, or other dielectric materials that are deposited in thin layers (e.g., <10% of the total height of the contact) and are resistant to the etching chemistry used to form the contact opening in the first ILD and second ILD. In some embodiments, the first ILD includes multiple dielectric materials layered on top of each other. In some embodiments, first ILD 104 includes a layer of gate dielectric oxide that is also situated on a top surface of a substrate and forms part of a gate structure on the substrate.

A second interlayer dielectric material (second ILD) 112 is over CESL 110. In some embodiments, second ILD 112 is directly on a top surface of CESL 110. In some embodiments, first ILD 104 and second ILD 112 independently include, but are not limited to, one or more of silicon dioxide, porous silica, fluorinated silicon dioxide (fluorinated silicon glass, or FSG), and so forth. CESL 110 is a dielectric material with a different etch rate than first ILD 104 and second ILD 112. In some embodiments, CESL 110 includes two or more layers of dielectric materials layered together above, or on, a top surface of first ILD 104. According to some embodiments, multiple layers of etch stop materials are used in order to promote improved dimensional control of contact openings extending into first ILD 104 to help alleviate photolithographic variance in forming an upper portion of the contact. In some embodiments, contact etch stop layer 110 has a lower etch rate than the etch rate of first ILD 104 during an etch process to form a lower portion of a contact 106. According to some embodiments, CESL 110 is a silicon nitride layer, a silicon oxy-nitride layer, a silicon carbide layer, or another etch stop layer known to practitioners of the art. In some embodiments, the second ILD is a same material as the first ILD. In some embodiments, the second ILD is a different dielectric material than the first ILD. In some embodiments, the second ILD includes multiple layers of dielectric material.

Contact 106 has an upper portion 107A that extends through second ILD 112, and a lower portion 107B that extends through first ILD 104 and is against a top surface of substrate 101. In some embodiments, contact 106 is for electrically connecting to a source region of a transistor. In some embodiments, contact 106 is for electrically connecting to a drain region of a transistor. In some embodiments, contact 106 is for electrically connecting to a region shared by two transistors as a source or drain region of the transistor. Upper portion 107A corresponds to a portion of the contact (see also contact 382 in FIG. 3D) extending through the second ILD 112 and above the contact etch stop layer (CESL) 110. A lower portion 107B of contact 106 corresponds to a portion of the contact level with the CESL 110 and the first ILD 104 (e.g., portions of the contact below the interface between second ILD 112 and the CESL 110). Upper portion 107A has an upper sidewall segment 108A with a first sidewall angle ($\theta_1$) 114A and a first slope, and lower portion 107B has a lower sidewall segment 108B with a second sidewall angle ($\theta_2$) 114B and a second slope steeper than the first slope. According to some embodiments, a reference line 126 extends parallel to a top surface of the second ILD at the top of the contact opening. First sidewall angle ($\theta_1$) (or, a first slope) 114A is the angle between the reference line 126 and the upper sidewall segment 108A. Second sidewall angle ($\theta_2$) (or, a second slope) 114B is between the top surface of substrate 101, where the contact has exposed the substrate top surface, and lower sidewall segment 108B. In some embodiments, second sidewall angle ($\theta_2$) (or, a second slope) 114B is measured next to the barrier layer. In some embodiments, second sidewall angle ($\theta_2$) (or, a second slope) 114B is measured at a bottom of the contact or contact opening, adjacent to substrate 101. According to some embodiments, first sidewall angle 114A ranges from about 45° to about 85°. When the first sidewall angle 114A is smaller than about 45°, the perimeter of the contact in the top surface of the second ILD becomes large enough that the contacts encroach with each other or with contacts that extend to the gate electrode. When the first sidewall angle 114A is larger than about 85°, the difference in slope (or, sidewall angle) between the upper region and the lower region loses effectiveness at reducing and/or eliminating the fill problems or voids associated with source/drain contacts for small-dimension transistors in an integrated circuit. A ration of the smallest slope of the first sidewall angle and the largest slope of the first sidewall angle is not greater than (85°/45°=1.88). According to some embodiments, second sidewall angle 114B ranges from about 85° to about 89.5°. When the second sidewall angle is smaller than about 85°, the footprint of the transistor becomes too large for a circuit layout of the integrated circuit to conform to the design guidelines and layout parameters of the transistor and remain within a designated transistor area of the circuit layout.

According to some embodiments, an intermediate sidewall segment 108C is defined by the exposed portion of CESL 110, between second ILD 112 and upper sidewall segment 108A, and first ILD 104 and lower sidewall segment 108B. At intermediate sidewall segment 108C, contact 106 has a diameter 111C at the interface between the first ILD 104 and the CESL 110. At the top surface of second ILD 112, contact 106 has a diameter 111A. At a bottom of first ILD 104, near substrate 101, contact 106 has a diameter 111B. Lower sidewall segment 108B is, at a closest point 116, a first separation distance ($D_1$) 118 away from a sidewall 120 of first gate structure 102 that is closest to the contact 106. According to some embodiments, closest point 116 is near a top of gate structure 102. According to some embodiments, closest point 116 is near a middle of the gate structure 102. According to some embodiments, diameter 111C, at the CESL level, is less than or equal to 110% the diameter 111B at the bottom of the contact. According to some embodiments, diameter 111A at the top of the contact, is at least 115%, but less than or equal to 200%, the length of diameter 111C. When contact diameters are too large, the contact is too close to the gate structure and device failure is more likely, in some instances. Device failure is likely to occur through forming of an electrical short as the dielectric materials between the contact and the gate structure break down in strong electrical fields.

Second ILD 112 has a top surface 124. Upper sidewall segment 108A meets top surface 124 at location 127. Lower sidewall segment 108B meets substrate 101 at location 129. Location 128 is a point on top surface 124 that is directly over location 131, the closest point on gate structure 102 to contact 106. First separation distance $D_1$ is measured between closest point 116 on contact 106 and location 131 on gate structure 102. Second separation distance ($D_2$) 130 is measured between location 127 and location 128. In some embodiments, location 127 is directly above gate structure 102 and second separation distance $D_2$ is measured on top surface 124. In some embodiments, location 128 is on a top surface of contact 106 (not shown) and second separation distance 130 is measured (not shown) on a top surface of contact 106. Second separation distance $D_2$ is a distance between the edge of the contact and the dielectric material directly over the gate structure. Second separation distance $D_2$ is as large as possible, within constraints imposed by the IC design, in order to reduce likelihood of interference or shorting between the contact to a source/drain region of the semiconductor device, and a contact (not shown) in electrical connection with the gate structure to regulate current flow through the channel in substrate 101. When $D_2$ is zero, or less than zero (e.g., when the edge of the contact is directly over the gate structure, or when location 128 is on a top surface of the contact), the separation between the source/drain contact and the gate structure contact is achieved by displacing the gate structure contact laterally along the top of the gate structure, away from the encroaching source/drain contact.

First ILD 104 has a first thickness 132, and second ILD has a second thickness 134. The barrier layer, CESL 110, has a third thickness 136 that is sufficient to withstand an etch process that forms the upper portion of the contact opening during a manufacturing process. Third thickness 136 varies according to etch processes used to make a two-sloped contact, such as contact 106, according to some embodiments. A two-slope contact is a contact with a sidewall that has a demarcation between upper and lower regions (see FIG. 1, upper sidewall segment 108A and lower sidewall segment 108B). When the upper sidewall segment and the lower sidewall segment each have approximately constant slopes along the segments, and a change of slope of the contact sidewall occurs at a junction between the segments, the contact sidewall has the distinctive "two slope" profile. The lower sidewall segment has a first thickness 132 that is larger than the gate height 138 of the gate structure 102, so that the junction between upper sidewall segment 108A and lower sidewall segment 108B is above the top of the gate structure 102.

According to some embodiments, first thickness 132 ranges from about 80 nanometers (nm) (800 Å) to about 130 nm (1300 Å). The first thickness of the first ILD is larger than the height of the gate structure because the first ILD covers the gate structure and separates the gate structure from the barrier layer between the first ILD and the second ILD. The thickness of the first ILD is maintained in the various embodiments at approximately 10-15 nm larger than the gate structure height in order to preserve the separation between the barrier layer and the top of the gate structure. As the first thickness falls below the 10-15 nm separation distance, the benefit of the electrical isolation of the gate structure decreases as the contact material is located closer to the gate structure, making dielectric breakdown more likely.

In some embodiments, the second interlayer dielectric 112 has a second thickness ranging from about 50 nm (500 Å) to about 240 nm (2400 Å). In embodiments having a large second thickness (e.g., ranging from about 100 nm to 240 nm), the larger (e.g., approaching 90°) sidewall angle achieves the lateral displacement of the contact edge (see location 127, FIG. 1) toward the gate structure location using the larger thickness of second ILD 112. As the thickness of second ILD decreases to between about 50 nm and about 100 nm, the sidewall angle decreases, achieving the lateral displacement of the contact edge (see location 127, FIG. 1) toward the gate structure location in a shorter vertical run. A second ILD film having a thickness below about 50 nm is not able to achieve the lateral displacement of the contact edge toward the gate structure location with the reduced height. Low-sidewall angle contact openings are more difficult to achieve, and have the risk of exposing the barrier layer at regions next to the barrier layer opening. Barrier layer exposure introduces barrier layer erosion during the etch process of the first ILD, making the diameter and shape of the opening in the first ILD less uniform or predictable.

In some embodiments, the barrier layer has a thickness ranging from about 20 Å to about 50 Å. In some embodiments, increasing the barrier layer thickness help maintain dimensions and uniformity (across the wafer) of the barrier layer openings. Increasing the barrier layer thickness beyond 50 Å tends to introduce nonuniformity in the barrier layer open etch, leading to punchthrough into the first ILD by the etch process for barrier layer opening, making the etch time for first ILD etch more difficult to characterize. Barrier layers less than 20 Å are associated with uneven barrier layer coverage, resulting in punchthrough and uneven etch of the first ILD during the contact etch process. When a junction between the upper sidewall segment and the lower sidewall segment occurs at or below the level of the top of the gate structure, the contact is still at risk of breaking down the dielectric material between the contact and the gate structure to a greater degree than when the junction is above the top of the gate structure. When the position junction is too low, as compared to the top of the gate structure, the shallower slope of the upper sidewall actually increases the risk of dielectric breakdown between contact and gate structure.

Figure 2:
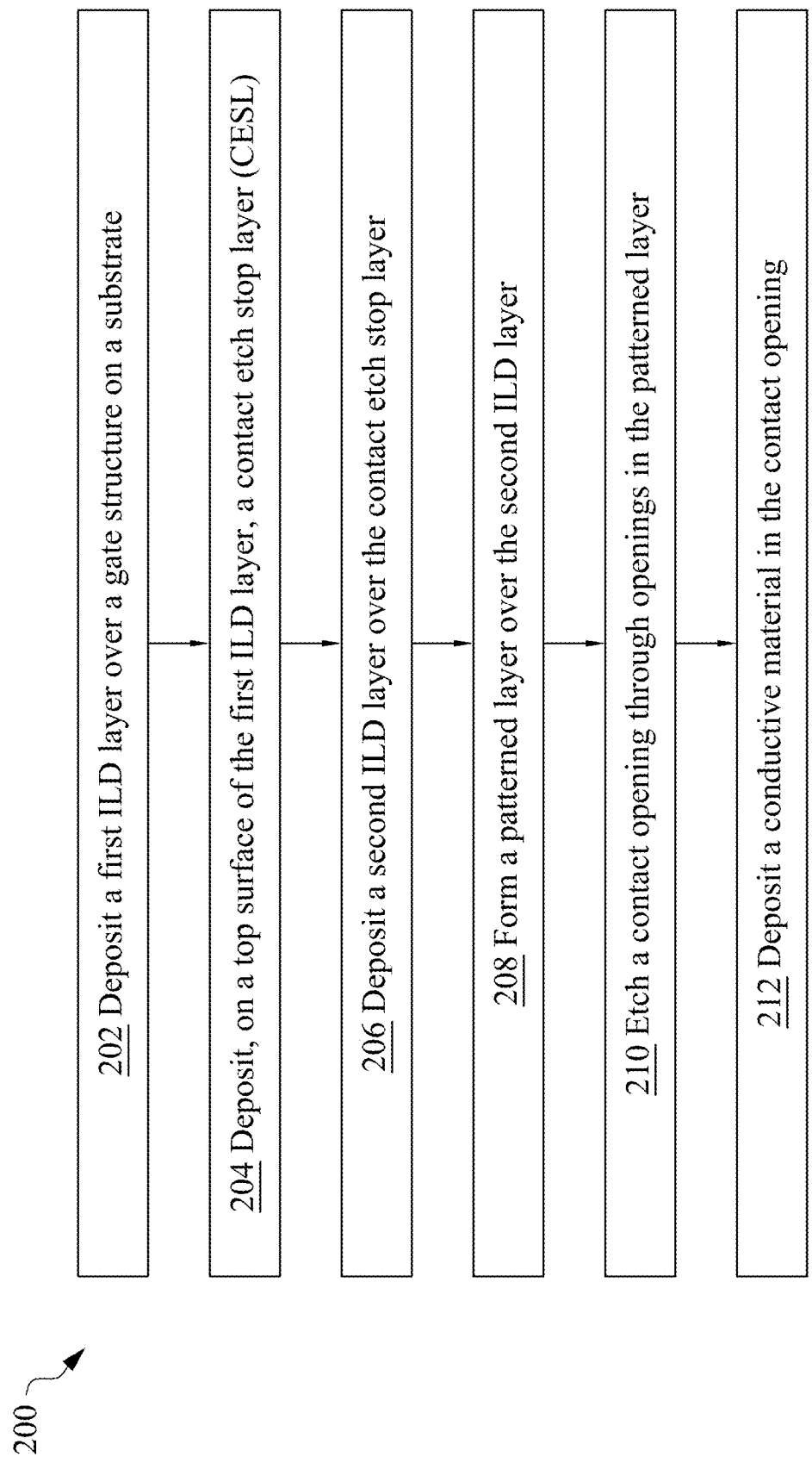
FIG. 2 is a flow diagram of a method of making a semiconductor device, in accordance with some embodiments.
Figure 3A:
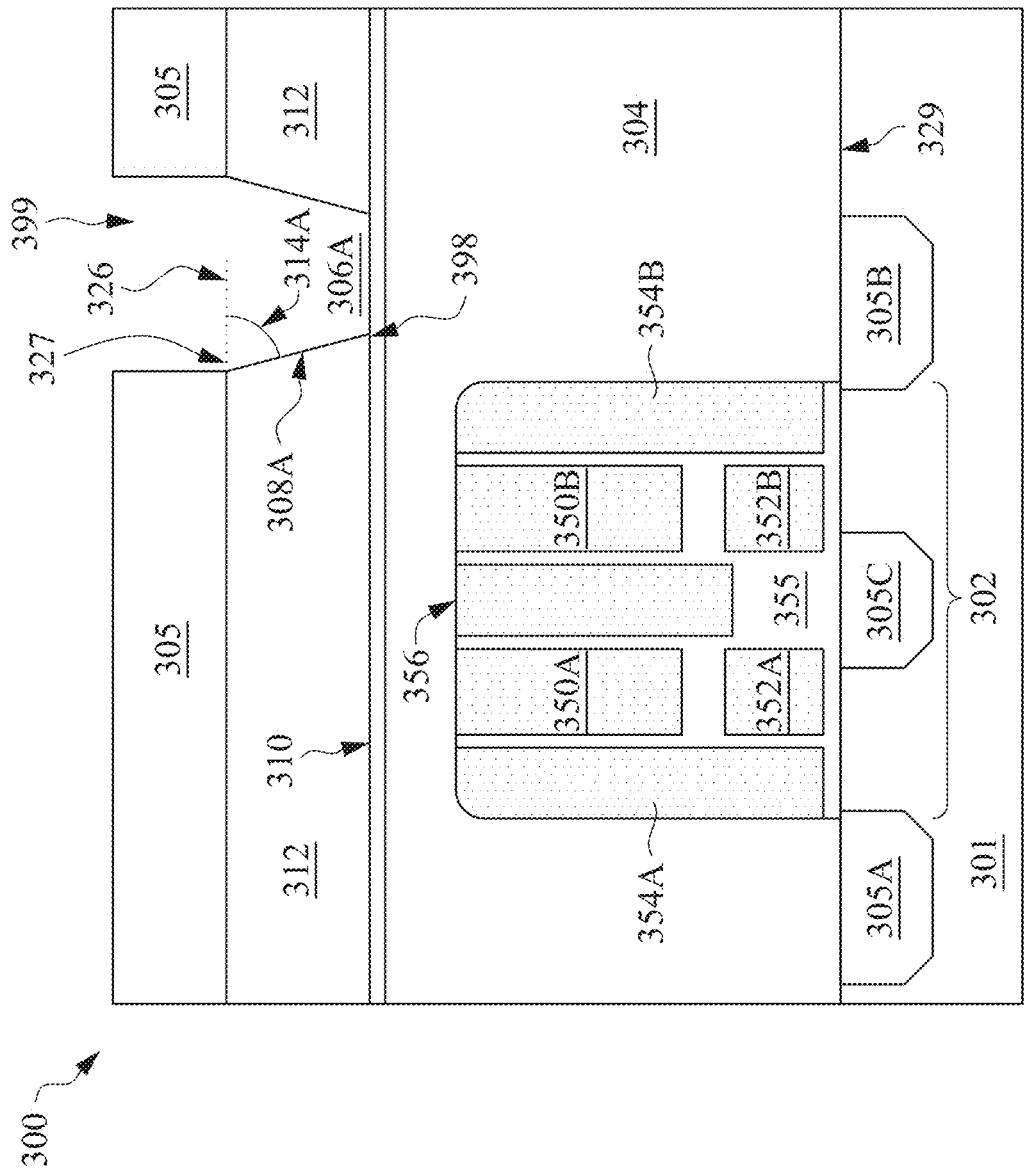
FIGS. 3A-3D are schematic diagrams of a semiconductor device during a manufacturing process, in accordance with some embodiments.
Figure 3B:
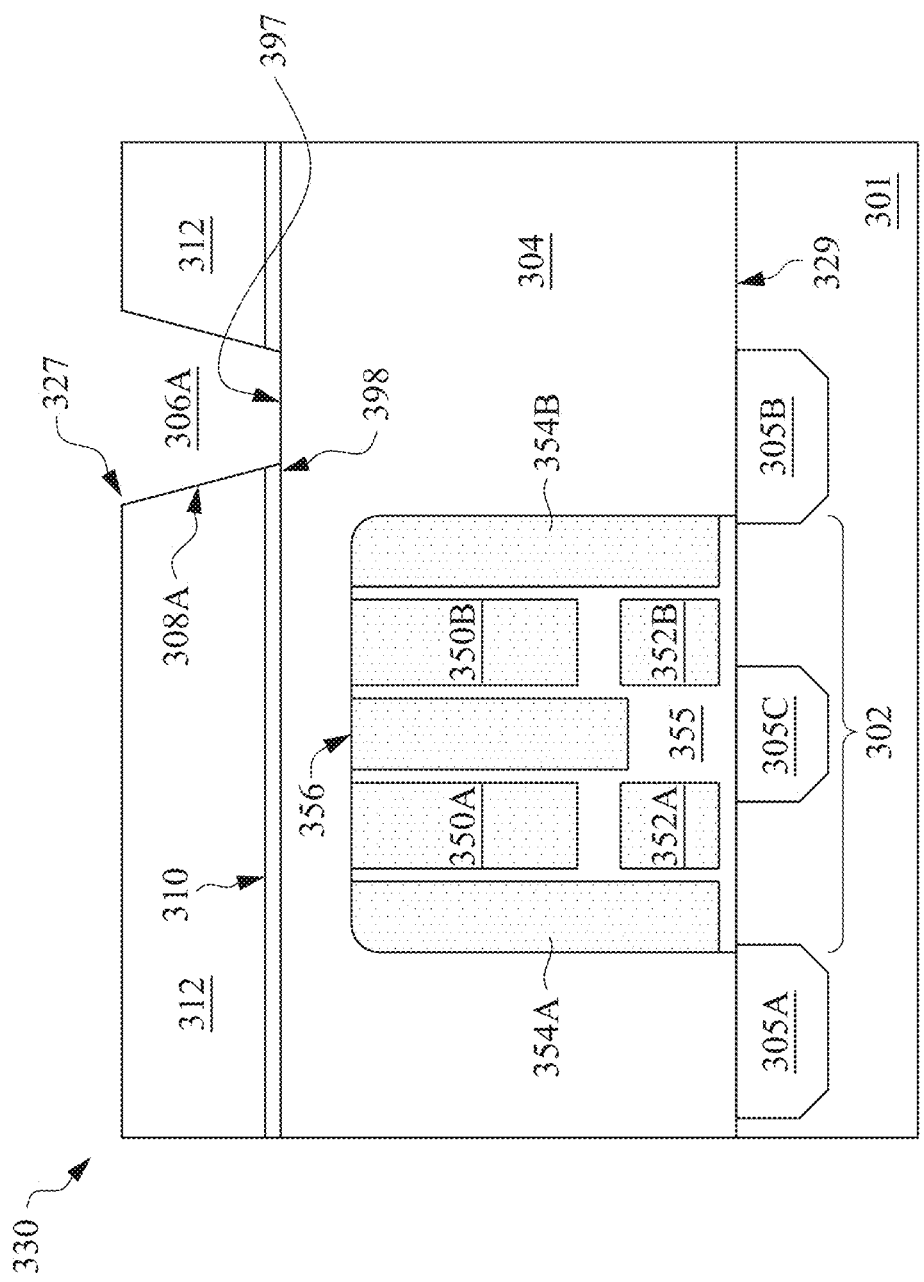
Figure 3C:
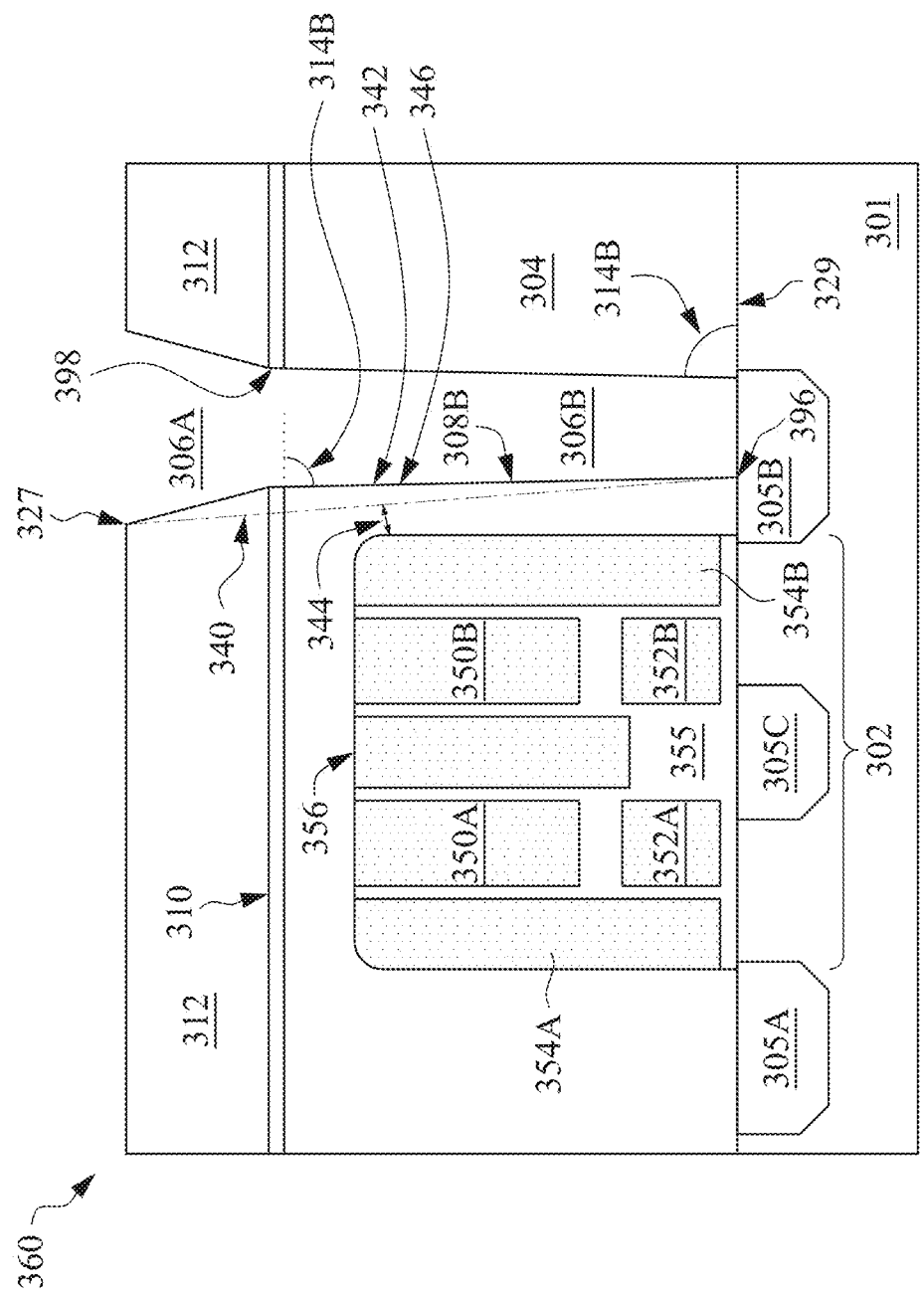

FIG. 2 is a flow diagram of a method 200 of making a two-slope contact, according to some embodiments. FIGS. 3A-3C are cross-sectional diagrams of a semiconductor device during a manufacturing process, according to some embodiments. In operation 202, a first ILD layer is deposited on a substrate, where the substrate has a gate structure or transistor on the substrate top surface. Inter-layer dielectric films are deposited by, for example, processes such as atomic layer deposition and chemical vapor deposition (CVD), including plasma enhanced chemical vapor deposition (PE-CVD), high-pressure chemical vapor deposition (HP-CVD), vapor-phase epitaxy (VPE), and so forth.

According to some embodiments, the substrate has a flat top surface. In some embodiments, the substrate includes a semiconducting material, where regions of the layer of semiconducting material has N-doped and/or P-doped regions to serve as source and drain regions of an integrated circuit. According to some embodiments, the substrate is a textured substrate, where the substrate has been etched into fins that serve as source, drain, and channel regions of a transistor in a semiconductor device. According to some embodiments, the first ILD layer is deposited into recessed regions of the semiconductor material to isolate adjoining fins, gate structures, and/or contacts electrically connected to transistor source/drain or gate structures from each other.

First ILD 304 is situated on substrate 301 and over gate structure 302.

In operation 204, a barrier layer is deposited onto the first ILD to allow a two-slope contact to be formed by multiple etch processes, and a constriction of the contact at an opening through the barrier layer. Barrier layer 310, a contact etch stop layer, is on a top surface of first ILD 304. A barrier layer is deposited onto first ILD 304 using, for example, atomic layer deposition, sputtering, or chemical vapor deposition processes familiar to practitioners of the art. A barrier layer material is selected for a semiconductor device according to a desired selectivity of the barrier layer to plasma etch conditions for the first ILD and/or the second ILD. In particular, the ability of the barrier layer material to resist lateral etch under plasma etching conditions In some embodiments, barrier layer 310 is a single film of a single dielectric material, such as silicon nitride or silicon carbide. In some embodiments, barrier layer includes multiple layers of dielectric material different from first ILD 304, or second ILD 312. In some embodiments, first ILD 304 is a single dielectric material. In some embodiments, first ILD 304 is a plurality of dielectric materials deposited to cover and isolate gate structure 302 from electrically conductive components of a semiconductor device near to the gate structure.

In operation 206, a second ILD is deposited over the barrier layer, in which an upper portion of a two-slope contact is formed. Inter-layer dielectric films are deposited by, for example, processes such as atomic layer deposition and chemical vapor deposition (CVD), including plasma enhanced chemical vapor deposition (PE-CVD), high-pressure chemical vapor deposition (HP-CVD), vapor-phase epitaxy (VPE), and so forth. Second ILD 312 is over barrier layer 310. In some embodiments, second ILD 312 is directly against barrier layer 310. According to some embodiments, second ILD 312 is a different dielectric material than first ILD 304. In some embodiments, second ILD 312 is a same dielectric material as first ILD 304. According to some embodiments, second ILD 312 is a single dielectric material. In some embodiments, second ILD 312 is more than one ILD material layered on top of each other.

In operation 208, a patterned mask layer is formed on a top surface of a second ILD layer. In some embodiments, a patterned mask layer is formed by depositing a layer of photoresist or organic masking layer on a substrate, exposing the photoresist or organic masking layer to light to modify the solubility of portions of the layer. Methods of forming the patterned mask layer further include dissolving modified portions of the mask layer in order to expose a portion of top surface of the second ILD layer. In some embodiments, the patterned mask layer is a patterned photoresist layer. In some embodiments, the patterned mask layer is a mask layer suitable for electron-beam patterning. In some embodiments, the patterned mask layer is a self-assembled mask layer.

In operation 210, a series of etch steps are performed in order to form a two-slope contact through the ILD layers and the barrier layer. FIGS. 3A-3C are cross sectional diagrams of semiconductor devices 300, 330, and 360 representative of changes to a semiconductor device during operation 210. Gate structure 302 is on a top surface of substrate In some embodiments of operation 210, at least one of the etch steps is a plasma etch step that has an etch chemistry and plasma conditions that etch second ILD 312 faster than barrier layer 310. Some embodiments of operation 210 include multiple etch processes. In some embodiments of operation 210, a first etch process removes a portion of the second ILD and exposes the barrier layer, a second etch process removes a portion of the barrier layer exposed by the first etch process, and exposes the first ILD, and a third etch process removes a portion of the first ILD exposed through the opening in the barrier layer, and exposes the substrate below the first ILD. In some embodiments, the first etch process removes a portion of the second ILD and stops before the barrier layer is exposed, a second etch process removes a remaining portion of the second ILD and removes the portion of the barrier layer exposed after the remaining portion of the second ILD is removed, exposing the first ILD, and a third etch process removes a portion of the first ILD exposed through the opening in the barrier layer, and exposes the substrate below the first ILD. In some embodiments, the first etch process is selective to the barrier layer material (e.g., the etch process etches the barrier layer material more slowly than the material of the first ILD). In some embodiments, the second etch process is less selective to the barrier layer material than the first etch process. In some embodiments, the third etch process is selective to the material of the barrier layer. When the third etch process is selective to the material of the barrier layer, the third etch processes removes the first ILD more quickly than the barrier layer material. In some embodiments, after the opening in the barrier layer is formed, the material of the barrier layer has a low lateral removal rate because the third etch process is highly anisotropic. In some embodiments, the third etch process has a low lateral removal rate into the material of the barrier layer because the third etch process also produces a polymeric material which covers the sidewall of the contact opening during the third etch process. In some embodiments, the removal rate of the first ILD is increased, with respect to the removal rate of the barrier layer material, by decreasing the pressure at which the etch process is performed and/or by increasing an acceleration voltage for ions generated by the etch process.

In FIG. 3A, an upper portion of the contact opening 306A has been etched to expose the top surface of barrier layer 310. An opening 399 in a patterned mask layer 305, such as a patterned photoresist material, or other lithographic-type mask, sets the shape and dimensions of the upper portion of the contact opening 306A. Reference line 326 extends parallel to a top surface of barrier layer 310, at a top surface of second ILD 312. First sidewall angle 314A is measured between reference line 326 and upper portion of the contact sidewall 308A.

In FIG. 3B, the upper portion of the contact opening 306A has been extended after an etch process has removed the exposed portion of the barrier layer 310, exposing a top surface 397 of the first ILD 304. Upper portion of the contact sidewall 308A extends from location 327 to location 398.

In FIG. 3C, a lower portion 306B of the contact opening has been formed after e.g., a third etch process as described above. Lower portion of contact sidewall 308B extends from location 398 to location 396 (against the top surface 329 of the substrate 301. Lower portion of contact sidewall 308B has a second sidewall angle 314B different form the first sidewall angle 314A. The lower portion of the contact sidewall 308B is more vertical then the upper portion of the contact sidewall.

In FIG. 3C, a projection line 340 extends from location 327, at a top edge of the upper portion of contact opening 306A, to location 396. Projection line has a closest point 342 at a third separation distance ($D_3$) 344 from location 331, a position on gate structure 302 that is closest to closest point 342 on projection line 340. Projection line 340 represents a slope of a single-slope contact sidewall that extends from location 327 to location 396, according to some embodiments of the present disclosure. Without barrier layer 310, an etch process to form the contact opening results in a contact having a sidewall profile that substantially follows projection line 340. Third separation distance ($D_3$) 344, between projection line 340 and gate structure 302, violates a design rule of an integrated circuit because ILD 304 with a thickness equal to third separation distance ($D_3$) 344 is more susceptible to dielectric breakdown than indicated by the design rule of the integrated circuit. Thus, a single etch process is not able to shape the majority of a contact sidewall profile having a profile substantially aligned with projection line 340. Third separation distance ($D_3$) 344 is smaller than a fourth separation distance ($D_4$) (not shown, but analogous to first separation distance ($D_1$) 118 in FIG. 1) between location 331 and the location 346, an actual location on the lower contact sidewall 308B that is closest to location 331 on gate structure 302.

Figure 3D:
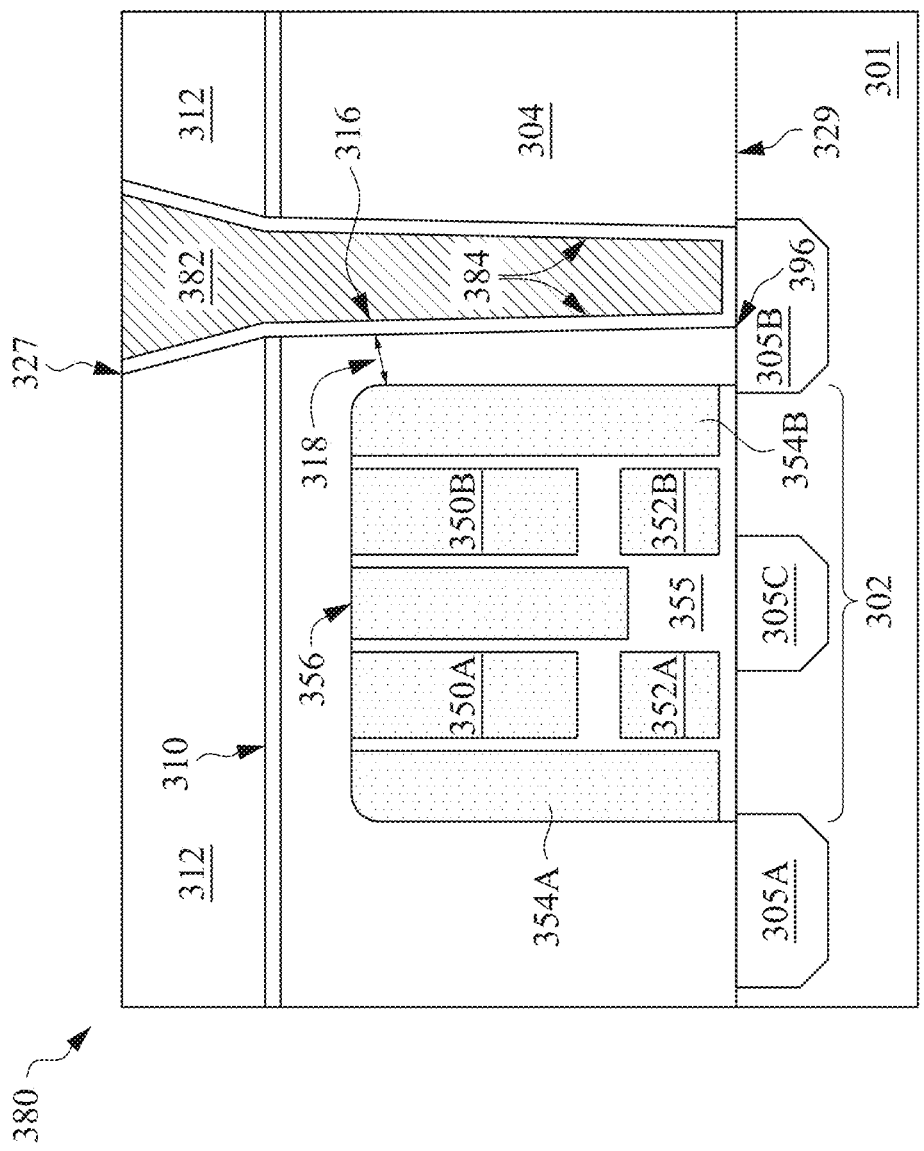

In FIG. 3D, a semiconductor device 380 includes a conductive contact 382 extending through the dielectric layers and reaching a top surface (not shown) of substrate 301. Elements in FIG. 3D similar to those numbered in FIG. 1 have an identifying similar to the number provided in FIG. 1, incremented by 200.

A first separation distance 318 is the distance between the closest point 316 on the sidewall of the contact to location 331 of the gate structure 302, where location 331 is the position closest to the closest point 316 of the contact sidewall. Optional glue layer 384 comprises an outer portion of conductive contact 382. According to some embodiments, optional glue layer 384 is a titanium layer deposited within a contact opening prior to filling the contact openings with a conductive material. A glue layer is a thin layer of material which, after deposition, promotes improved adhesion between the fill material of the contact and the sidewalls of the opening into which the contact is filled. Glue layers are sometimes used in cases of lattice mismatch between the dielectric material and the metal or conductive material filling the contact. In some instances, a glue layer is used in addition to a barrier layer that reduces diffusion of conductive-material (e.g., metal) atoms into the dielectric materials around a gate structure. In a non-limiting embodiment, a titanium glue layer is deposited directly against a sidewall of the contact opening, and a titanium nitride barrier layer is deposited on top of the glue layer within the contact opening. After deposition of glue layer and barrier layer, the contact opening is filled with a metal using a sputtering process. In a non-limiting embodiment, tungsten is sputtered into a contact opening on top of a titanium glue layer and a titanium nitride barrier layer. In some embodiments, the barrier layer is deposited directly onto the contact opening sidewall, and the glue layer is deposited on top of the barrier layer. Other examples of glue layers and barrier layers known to practitioners having ordinary skill in the art are also included within the scope of the present disclosure, including nickel, silver, platinum, palladium, and/or cobalt as glue layers, and further including a nitride layer as the barrier layer. In some embodiments, barrier layer materials include nitrided alloys of nickel, silver, platinum, palladium, and/or cobalt.

In operation 212, a conductive material is deposited into the contact opening formed during operation 210. In some embodiments of method 200, a liner layer is optionally deposited on the sidewall of the contact opening, over both the upper sidewall against the second ILD, and the lower sidewall over the first ILD. In some embodiments of method 200, a diffusion barrier layer is optionally deposited on the sidewall of the contact opening over both the upper sidewall against the second ILD, and the lower sidewall over the first ILD. In some embodiments, the conductive material is deposited by a sputtering process. In some embodiments, the conductive material is deposited by a chemical vapor deposition process, including one or more of plasma enhanced CVD (PECVD), low pressure CVD (LPCVD), and other CVD techniques known in the art. In some embodiments, the conductive material deposited into the contact opening is polysilicon, a pure metal, or a metal alloy, according to materials consistent with the formation of contacts to transistors in semiconductor devices.

There are several benefits that are associated with a two-slope contact as disclosed herein. One benefit to a semiconductor device is a lower incidence of electrical shorts between the contact and the gate structure nearest to the contact. With a two-slope contact, the area of the contact top may, according to some embodiments, be larger than for a single-slope contact having a same separation distance between the contact and the nearest gate structure. An increase in the area of the top of the contact makes misalignment of the contact with an overlaying interconnecting structure (a via, or a trench) more difficult.

One benefit to a semiconductor device is improvement in the glue layer process window. The glue layer process window includes operations associated with depositing titanium glue layer, deposition of a barrier layer (such as a titanium nitride barrier), and operations associated with filling contact openings with tungsten to form contacts between layers of the integrated circuit. With a larger top opening, filling conductive material into the contact is less prone to make voids or have metal delamination from the contact sidewalls. Voids tend to occur in contacts when the conductive material being deposited into a contact opening collects at a slower rate on the lower sidewalls of the contact opening, and at a faster rate on the upper sidewalls of the contact opening, or at the top edge of the contact sidewall. An increased deposition rate at the upper portion of the contact opening, or at the top edge of the contact opening, restricts the area of the contact opening into which new conductive material enters the contact opening to fill the contact. As the area of the opening shrinks, the overall deposition rate of conductive material decreases, an imbalance occurs and/or accelerates, between deposition rate at the upper portion and the middle/lower portion of the contact structure during conductive material deposition. According to some embodiments, increasing the area of the contact opening on a top surface of the substrate in which the conductive material is being deposited promotes more uniform deposition rates between the top, middle, and bottom of a contact opening. According to some embodiments, regulating the slope of the contact opening sidewall (to be less vertical) also impacts the distribution of deposition rates between the top, middle, and bottom of a contact opening. In some embodiments, however, the increased contact opening area (e.g., the increased contact opening diameter) and the less vertical contact sidewall puts the contact sidewall closer to the gate structure, creating a greater likelihood of electrical shorting between the contact structure and an adjoining gate structure.

In some instances, the conductive materials are deposited into contact openings in a substrate, or inter layer dielectric (ILD) and on a top surface of the substrate as a blanket layer on the top of the substrate. In some instances, when a blanket layer of conductive material is deposited onto a substrate, a top portion of the conductive material layer is removed to leave portions of conductive materials in the openings in the ILD. In some embodiments contacts, or vias, have liner layers and/or diffusion barriers on a contact sidewall between the ILD material and the conductive material deposited into the contact opening. In some embodiments, liner layers and/or diffusion barriers are on contact sidewalls in order to isolate the conductive material from the substrate layer, or to prevent diffusion of atoms of conductive material into the ILD material.

A patterning layer is deposited onto the top surface of the second portion and/or second dielectric material and the second dielectric material is etched with a first etch chemistry through an opening in the patterning layer until the barrier material is exposed. Etching the second material is performed, in some embodiments, by plasma etching with fluorine-containing chemistry that reacts with the second dielectric material When the barrier material is exposed, the plasma chemistry is changed to a second etch chemistry that is reactive with the barrier layer. In some embodiments, the second etch chemistry is selective to the second dielectric material and the first dielectric material. Once the barrier layer is etched-through and the first dielectric material is exposed, the second etch chemistry is changed to a third etch chemistry. In some instances, the first etch chemistry and the third etch chemistry are the same chemistry. In some instances, the first etch chemistry and the third etch chemistry are different chemistries. The third etch chemistry is selective to etching the first dielectric at a faster rate than the barrier material is etched. Thus, the diameter of the opening in the barrier material changes little, or not at all, while the first dielectric material is being etched-through to expose the substrate below the first dielectric material. While the first dielectric material is being etched, the diameter of the contact opening in the second dielectric material increases faster than the change in the diameter of the barrier material, making the slope of the upper portion of the contact sidewall larger (e.g., farther away from "vertical" or 90°, perpendicular to the substrate surface). The slope of the lower portion of the contact opening, through the first dielectric material, remains within 5° of "vertical" or perpendicular to the substrate surface. In some embodiments, the slope of the lower portion of the contact opening is less than 0.5° off of "vertical" or perpendicular. The first dielectric material is etched until the top surface of the substrate is exposed. The contact opening is later filled with conductive material.

For a two-slope or dual-slope contact, a closest point of the contact opening sidewall, or of the contact sidewall, to the side of the gate structure, is farther from the side of the gate structure than a side of the gate structure from a line extending between a point on the contact opening on the top surface of the second dielectric material closest to the gate structure, and a point of the contact opening on the top surface of the substrate on which the first dielectric material rests against the gate structure. Thus, a dual-slope contact opening or contact structure provides a larger amount of dielectric material between the contact and the gate structure, reducing the chance of shorting or dielectric breakdown between the contact and the gate structure.

Some aspects of the present disclosure relate to a device that includes a gate structure on a substrate; a dielectric film stack over the gate structure and the substrate, the dielectric film stack comprising a first inter layer dielectric (ILD) over the substrate and the gate structure; a barrier layer over the first dielectric material; a second ILD over the barrier layer; and a contact extending through the dielectric film stack, wherein an upper portion of the contact sidewall has a first slope, a lower portion of the contact sidewall has a second slope different from the first slope, and a transition from the first slope to the second slope occurs at a juncture of the contact and the barrier layer. In some embodiments, a thickness of the barrier layer is less than 10% of the total thickness of the first ILD, the barrier layer, and the second ILD. In some embodiments, the second slope is larger than the first slope. In some embodiments, the second slope ranges from at least 85° to not more than 89.5°. In some embodiments, the first slope ranges from at least 45° to not more than 85°. In some embodiments, the second ILD has a top surface substantially parallel with a top surface of the contact. In some embodiments, a ratio of a smallest value and a largest value of the first slope is not greater than 1.88. In some embodiments, the gate structure further comprises a dielectric spacer on a sidewall of the gate structure.

According to some embodiments, a semiconductor device includes a gate structure on a substrate; a dielectric film stack over the gate structure and the substrate, the dielectric film stack comprising a first inter layer dielectric (ILD) over the substrate and the gate structure; a barrier layer over the first dielectric material; a second ILD over the barrier layer; and a contact extending through the dielectric film stack, wherein a top of the contact has a first diameter; a bottom of the contact has a second diameter; and at the barrier layer, the contact has a third diameter, wherein the first diameter is not more than 2 times the third diameter. In an embodiment, the barrier layer is a silicon nitride layer. In an embodiment, the first ILD, the second ILD, and the barrier layer are different dielectric materials. In an embodiment, a slope of an upper portion of the contact sidewall against the first ILD is greater than 85°. In an embodiment, a slope of a lower contact sidewall against the second ILD is less than 85°. In an embodiment, the third diameter is at least 1.1 times the second diameter. In an embodiment, the first diameter is 1.15 times the third diameter. In an embodiment, the third diameter is at least 1.1 times the second diameter, and the first diameter is at least 1.15 times the second diameter.

Some aspects of the present disclosure relate to a method of making a semiconductor device that includes operations of depositing a first dielectric material on a substrate and a gate structure on the substrate; depositing a barrier material over the first dielectric material; depositing a second dielectric material over the barrier material; forming a patterned mask layer on a top surface of the second dielectric material; etching a two-slope contact opening, by: exposing a top surface of the barrier material by etching the second dielectric material through a first opening in the patterned mask layer; exposing a top surface of the first dielectric material by etching the barrier layer through a second opening in the second dielectric material; and exposing a substrate top surface by etching the first dielectric material through a third opening in the barrier material; and filling the two-slope contact opening with a conductive material, the conductive material being electrically connected to the top surface of the substrate. In some instances of the method a two-slope contact opening further comprises etching the first dielectric material with an etch process that is selective to the barrier material. In some instances of the method etching the second dielectric material further comprises etching the second dielectric material with a first etch process; stopping the first etch process before the barrier material is exposed by the first etch process; etching a remainder of the second dielectric material above the barrier material and below the first opening in the patterned mask layer with a second etch process that is selective to the barrier material. In some instances of the method etching the first dielectric material further comprises etching the second dielectric material with a first etch process that is not selective to the barrier material, and stopping the first etch process prior to exposing the top surface of the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a gate structure on a substrate;
   a source/drain region adjacent to the gate structure;
   a dielectric film stack over the gate structure and the substrate, the dielectric film stack comprising:
      a first inter layer dielectric (ILD) over the substrate and the gate structure;
      a barrier layer over the first ILD;
      a second ILD over the barrier layer; and
   a contact extending through the dielectric film stack and directly contacting the source/drain region, wherein
      an upper portion of a contact sidewall in the second ILD has a first slope of from at least 45° to not more than 85°,
      a lower portion of the contact sidewall in the first ILD has a second slope greater than the first slope, and
      a transition from the first slope to the second slope occurs at a portion of the contact extending through the barrier layer.

2. The device of claim 1, wherein a thickness of the barrier layer is less than 10% of a total thickness of the first ILD, the barrier layer, and the second ILD.

3. The device of claim 1, wherein a middle portion of the contact sidewall in the barrier layer has a third slope, the third slope being greater than or equal to the first slope and lesser than or equal to the second slope.

4. The device of claim 1, wherein the second slope is not greater than 89.5°.

5. The device of claim 1, further comprising a glue layer provided on the upper and lower portions of the contact sidewall.

6. The device of claim 1, wherein the second ILD has a top surface substantially parallel with a top surface of the contact.

7. The device of claim 1, wherein a value of the first slope is between a minimum value and a maximum value, and a ratio of the minimum value and the maximum value does not exceed 1.88.

8. The device of claim 1, wherein the gate structure is a split gate flash memory structure.

9. A semiconductor device, comprising:
   a gate structure on a substrate, the gate structure having a height $H_{GS}$;
   a source/drain region adjacent to the gate structure;
   a dielectric film stack over the gate structure and the substrate, the dielectric film stack comprising
      a first interlayer dielectric (ILD) over the substrate and the gate structure, the first ILD having a thickness $H_{ILD1}$;
      a barrier layer over the first ILD; and
      a second ILD over the barrier layer; and
   a contact extending through the dielectric film stack and directly contacting the source/drain region, wherein
      a top of the contact has a first diameter;
      a bottom of the contact has a second diameter;
      a portion of the contact extending through the barrier layer has a third diameter, wherein the first diameter is greater than the third diameter, and the first diameter is less than or equal to twice the third diameter; and
      the gate structure height $H_{GS}$ is at least 95% of the first ILD thickness $H_{ILD1}$.

10. The semiconductor device of claim 9, wherein the barrier layer is a silicon nitride layer.

11. The semiconductor device of claim 9, wherein the first ILD, the second ILD, and the barrier layer are different dielectric materials.

12. The semiconductor device of claim 9, wherein a slope of an upper portion of a sidewall of the contact against the first ILD is greater than 85°.

13. The semiconductor device of claim 9, wherein a slope of a lower contact sidewall against the second ILD is less than 85°.

14. The semiconductor device of claim 9, wherein the third diameter is at least 1.1 times the second diameter.

15. The semiconductor device of claim 9, wherein the first diameter is 1.15 times the third diameter.

16. The semiconductor device of claim 9, wherein the third diameter is at least 1.1 times the second diameter, and the first diameter is at least 1.15 times the second diameter.

17. A semiconductor device, comprising:
   a functional structure formed on a substrate;
   a source/drain region adjacent to the functional structure;
   a dielectric film stack over the functional structure and the substrate, the dielectric film stack comprising:
      a first inter layer dielectric (ILD) over the substrate and the functional structure;
      a barrier layer over the first ILD;
      a second ILD over the barrier layer; and
   a contact extending through the dielectric film stack and directly contacting the source/drain region, wherein
      an upper portion of a contact sidewall extending through the second ILD has a first slope of from at least 45° to not more than 85°,
      a lower portion of the contact sidewall extending through the first ILD has a second slope greater than the first slope, and
      a transition from the first slope to the second slope occurs at a portion of the contact extending through the barrier layer.

18. The semiconductor device of claim 17, wherein the first ILD further comprises a plurality of dielectric material sublayers.

19. The semiconductor device of claim 17, wherein the second ILD further comprises a laminar structure including at least two different dielectric materials.

20. The semiconductor device of claim 17, wherein the first ILD and the second ILD further comprise different dielectric materials.

* * * * *